United States Patent
Chujo et al.

(10) Patent No.: US 6,979,810 B2
(45) Date of Patent: Dec. 27, 2005

(54) OPTICAL MODULES AND METHODS OF MAKING THE OPTICAL MODULES

(75) Inventors: Norio Chujo, Tokyo (JP); Keiichi Yamamoto, Tokyo (JP); Akio Osaki, Tokyo (JP); Katsunori Hirano, Tokyo (JP); Takayuki Nakao, Yokohama (JP); Tomoaki Shimotsu, Yokohama (JP); Atsushi Hasegawa, Yokohama (JP); Tetsuya Aoki, Yokohama (JP); Takeshi Yamashita, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 571 days.

(21) Appl. No.: 09/930,806

(22) Filed: Aug. 15, 2001

(65) Prior Publication Data

US 2004/0067068 A1 Apr. 8, 2004

(51) Int. Cl.[7] .................. H01J 40/14; H03D 3/24; H04B 10/06
(52) U.S. Cl. .............. 250/214 R; 398/202; 375/376
(58) Field of Search ............. 250/214 R; 370/538, 370/540; 375/371, 373, 375, 376; 398/140, 141, 182, 202, 214

(56) References Cited

U.S. PATENT DOCUMENTS

| | | | | |
|---|---|---|---|---|
| 6,298,103 B1 | * | 10/2001 | Huang et al. ............ | 375/355 |
| 6,501,583 B1 | * | 12/2002 | Akashi et al. ............ | 398/202 |
| 6,580,532 B1 | * | 6/2003 | Yao et al. ............ | 398/39 |
| 6,631,144 B1 | * | 10/2003 | Johansen ............ | 370/516 |
| 2002/0001361 A1 | * | 1/2002 | Ueno et al. ............ | 375/376 |
| 2002/0159556 A1 | * | 10/2002 | Kishine et al. ............ | 375/376 |

FOREIGN PATENT DOCUMENTS

| CA | 02220622 | 11/1997 |
|---|---|---|
| DE | 197 40 957 | 3/1999 |

OTHER PUBLICATIONS

Behzad Razavi, Design of High–Sapeed Circuits for Optical Communication Systems, IEEE 2001 Custom Integrated Circuits Conference, Jul. 2001, 315–322, Electrical Engineering Department University of California, Los Angeles.

* cited by examiner

Primary Examiner—Stephone B. Allen
(74) Attorney, Agent, or Firm—Townsend and Townsend and Crew LLP

(57) ABSTRACT

A sample & hold type phase detector is used in a CDR IC and, in jitter transfer bandwidth adjustment, VCO output waveforms 90° out of phase with each other can be inputted to the phase detector, whereby a jitter transfer bandwidth can be calculated by only the measurement of frequency and of a DC voltage and it is possible to make a jitter transfer bandwidth adjustment in DC test for IC.

14 Claims, 12 Drawing Sheets

OPTICAL MODULES AND METHODS OF MAKING THE OPTICAL MODULES

BACKGROUND OF THE INVENTION

The present invention relates to optical modules and methods of making the optical modules, or electronic devices using the optical modules and optical communication systems using the optical modules.

FIG. 13 is a configuration diagram showing a conventional optical module with a jitter transfer bandwidth being adjusted and FIG. 14 is a flow chart showing an example of procedure from assembly to shipment of the conventional optical module.

As shown in FIG. 13, a optical receiver 65 has a PD or APD 66 for conversion from alight signal into an electric signal, a transimpedance amplifier 67 for current/voltage conversion, a voltage amplifier 68, and a CDR IC 27. The CDR IC 27 has a PLL 13 which comprises a phase detector 4, a filter circuit 7 and a VCO 12, a decision circuit 14, a data output buffer 15, and a clock output buffer 16.

In adjusting a jitter bandwidth of the optical module (CDR IC 27), an output signal from a pulse pattern generator 76 is converted to a light signal by means of a standard optical transmitter 75, which light signal is inputted to the optical receiver 65 through an optical fiber 64, and a clock output 65b from the optical receiver 65 is measured by means of a jitter analyzer 77.

As shown in FIG. 14, a conventional optical module manufacturing process is divided into an optical module assembling step (including the installation of CDR IC 27), an adjusting step (an optical module jitter transfer bandwidth adjusting step), and a test step.

Thus, after assembly of the optical module, the sensitivity of APD is adjusted and the jitter transfer bandwidth is measured. If the jitter transfer bandwidth satisfies a prescribed standard, the receiving module is tested for operation and is shipped if it passes the test. On the other hand, if the jitter transfer bandwidth does not satisfy the standard, a resistor R11 is replaced and the jitter transfer bandwidth is measured again. This is repeated until satisfying the standard for the jitter transfer bandwidth.

For example, on page 3 of a catalog (MP1777A-J-A-1-(4.00), Nov. 22, 2000) of Anritsu MP1777A there is described adjusting the jitter transfer bandwidth with use of a pulse pattern generator and a jitter analyzer. In the conventional jitter transfer bandwidth adjustment, CDR IC is operated at an actual speed.

SUMMARY OF THE INVENTION

However, in the conventional optical module manufacturing process it is necessary to use the expensive pulse pattern generator 76 and jitter analyzer 77 and the assembly of the module is followed by manual replacement of a resistor, requiring 10 minutes or so.

More particularly, the higher the operating frequency, the more expensive the pulse pattern generator and the jitter analyzer, and it takes several minutes for the measurement, thus resulting in an increase of the adjustment cost.

Besides, since the operation is performed at an actual speed, it is necessary that a signal be inputted to the IC at the same speed as in actual operation. Consequently, in a CDR IC of a high speed such as 2.5 Gbps or 10 Gbps, such a high-speed signal as 2.5 Gbps or 10 Gbps is not allowed to pass in a normal probe, so it is difficult to adjust the jitter transfer bandwidth, for example, by trimming a resistor in IC at the time of DC test for the IC, and it has so far been required to make the adjustment by using external resistor and capacitor after mounting the circuit board of module.

It is an object of the present invention to decrease the adjustment cost in the manufacture of an optical module and thereby provide a less expensive optical module.

It is another object of the present invention to provide a jitter transfer bandwidth adjusting method for an optical module less expensively.

The following is a brief description of typical inventions out of those disclosed herein for achieving the above-mentioned object.

In one aspect of the present invention there is provided an optical module including a photodiode or an avalanche photodiode for converting a light signal into an electric signal, a transimpedance amplifier for current/voltage conversion, a voltage amplifier, and a clock and data recovery IC, the clock and data recovery IC being subjected to adjustment of a jitter transfer bandwidth before being mounted on the optical module.

In another aspect of the present invention there is provided the above optical module wherein the clock and data recovery IC includes a phase locked loop, the phase locked loop comprising a voltage-controlled oscillator, a phase shifter for changing the phase of an output signal provided from the voltage-controlled oscillator, a selector for selecting either data provided from a data input pad or an output from the voltage-controlled oscillator, a phase detector, and a filter circuit which inputs an output signal from the phase detector and which provides an output signal to the voltage-controlled oscillator.

In a further aspect of the present invention there is provided an optical module including a photodiode or an avalanche photodiode for converting a light signal into an electric signal, a transimpedance amplifier for current/voltage conversion, a voltage amplifier, and a clock and data recovery IC, the clock and data recovery IC has a phase locked loop, the phase locked loop comprising a voltage-controlled oscillator, a +45 phase shifter for causing the phase of one branched output signal from the voltage-controlled oscillator to lead 45°, −45 phase shifter for causing the phase of the other branched output signal from the voltage-controlled oscillator to lag 45°, a selector for selecting either data provided from a data input pad or an output from the −45 phase shifter, a phase detector which compares the phase of the output selected by the selector with the phase of an output from the +45° phase shifter, and a filter circuit which receives an output from the phase detector and which provides an output signal to the voltage-controlled oscillator.

In a still further aspect of the present invention there is provided an optical module manufacturing method comprising the steps of adjusting a jitter transfer bandwidth of a clock and data recovery IC, mounting the thus-adjusted clock and data recovery IC onto an optical module, and mounting a photodiode or an avalanche photodiode which is for conversion from a light signal into an electric signal, a transimpedance amplifier which is for current/voltage conversion, and a voltage amplifier. It goes without saying that the jitter transfer bandwidth may be finely adjusted after mounting of the adjusted clock and data recovery IC.

In a still further aspect of the present invention there is provided an optical module manufacturing method wherein, in the step of adjusting the jitter transfer bandwidth of the clock and data recovery IC, the clock and data recovery IC includes a data input pad, a data output pad, a clock output pad, a phase detector, a voltage-controlled oscillator, and a phase shifter for changing the phase of an output waveform from the voltage-controlled oscillator, and at least two output waveforms outputted from the voltage-controlled oscillator and about 90° out of phase with each other are inputted to the phase detector.

In a still further aspect of the present invention there is provided an optical communication system including a multiplexer for time-multiplexing a signal, a optical transmitter, an optical fiber for the transmission of a light signal outputted from the optical transmitter, a optical receiver which receives a light signal from the optical fiber and converts it into an electric signal and which reproduces a clock, and a demultiplexer which separates the electric signal, the optical receiver being any of the foregoing optical modules.

DETAILED DESCRIPTION OF THE EMBODIMENTS

An optical module according to the present invention and a method of making the optical module, especially a jitter transfer bandwidth adjusting method, will be described below with reference to drawings.

Figure 11:
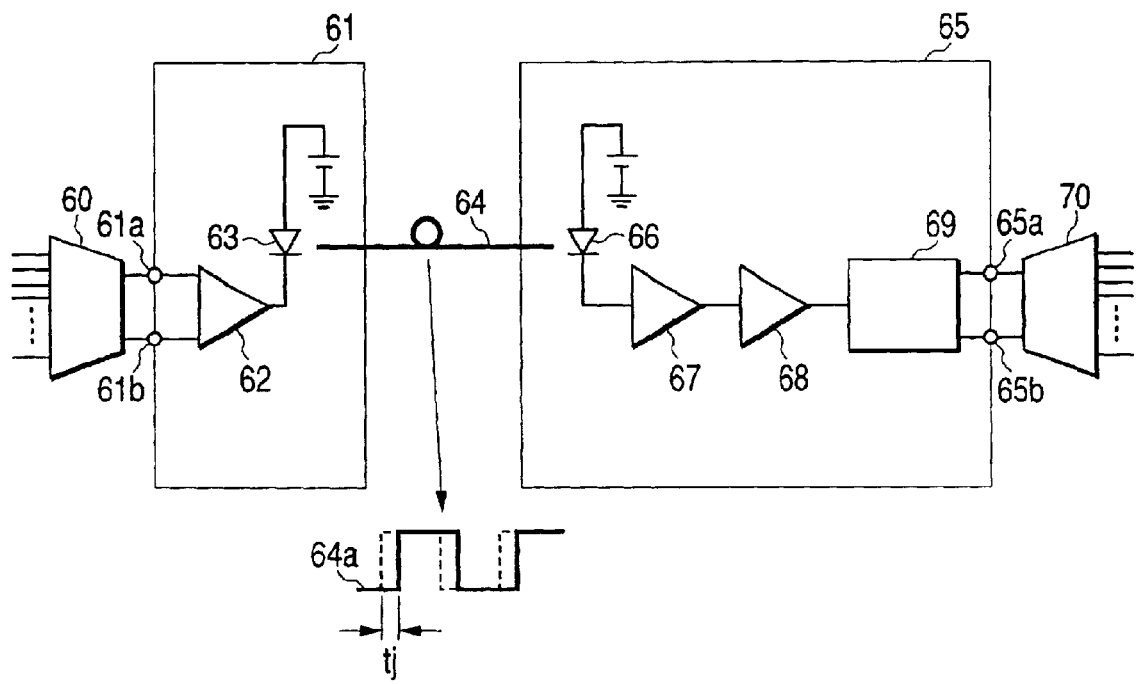
FIG. 11 illustrates a configuration of an optical communication system.

First, an example of an optical communication system using the optical module according to the present invention will be described with reference to FIG. 11. In the same figure, an optical communication system comprises a multiplexer 60 for time-multiplexing a signal which has been subjected to a processing such as switching, a optical transmitter 61, an optical fiber for the transmission of a light signal outputted from the optical transmitter 61, a optical receiver 65 which receives a signal from the optical fiber 64 and converts it into an electric signal and which reproduces a clock, and a demultiplexer 70 which separates a signal so as to facilitate a digital processing.

The optical transmitter 61, which receives a data signal 61a and a clock signal 61b from the multiplexer 60, has a laser diode 63 and a driver IC 62 for driving the laser diode 63.

The optical receiver 65 has a photodiode ("PD" hereinafter) or an avalanche photodiode ("APD" hereinafter) for conversion from a light signal into an electric signal, a transimpedance amplifier 67 for current/voltage conversion, a voltage amplifier 68, and a CDR IC 69.

Usually, only the data signal is transmitted to the optical fiber.

Both data signal and clock signal are needed for processing in a digital system, so in the optical receiver a clock signal is extracted from a data signal in CDR IC and waveform is re-shaped using the clock.

Figure 12:
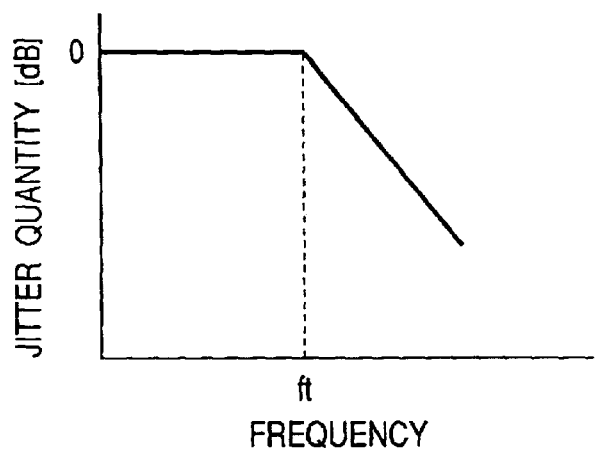
FIG. 12 illustrates a jitter transfer characteristic of an optical communication module and CDR IC.
Figure 13:
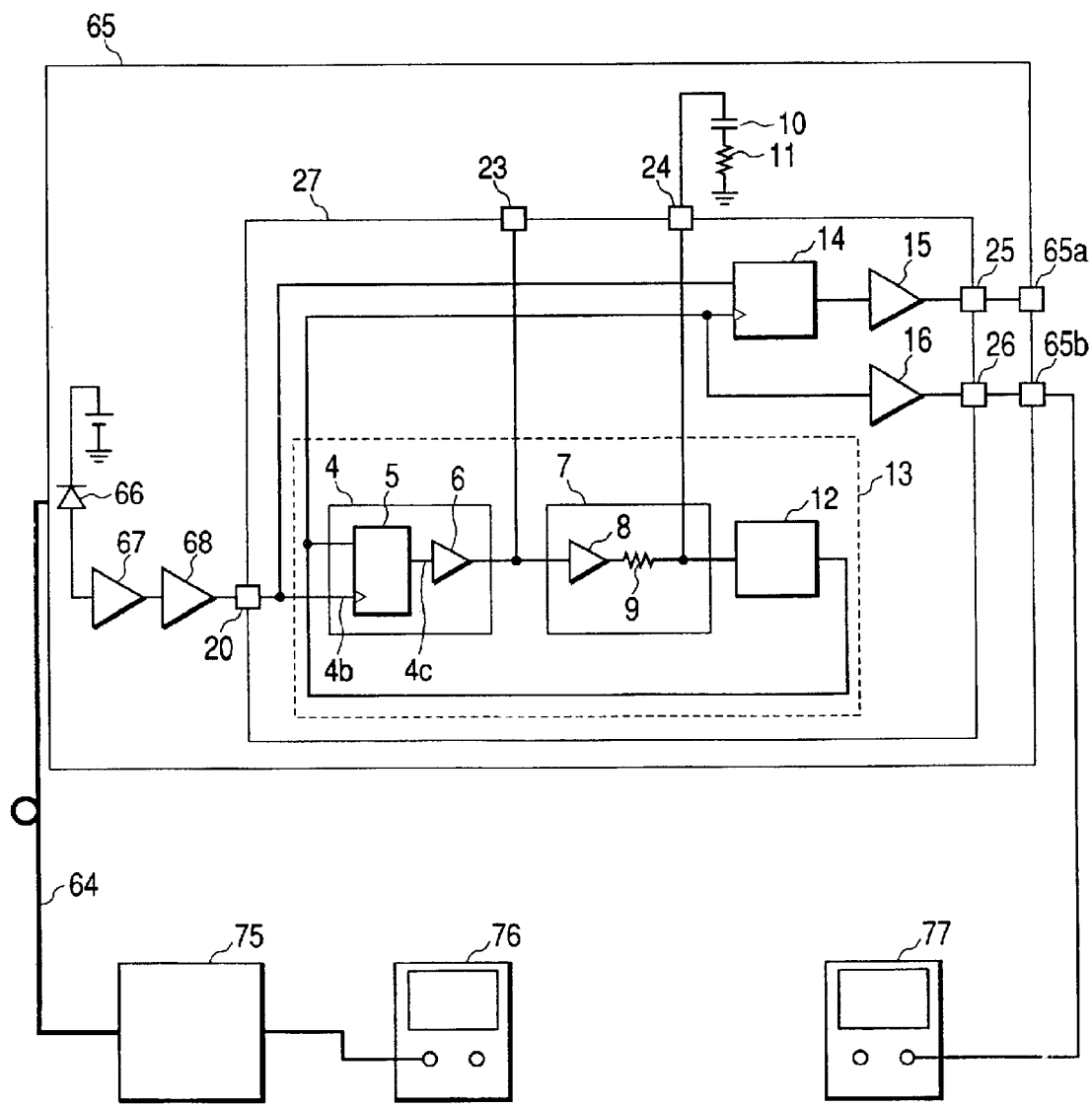
FIG. 13 illustrates a configuration in adjusting a jitter transfer bandwidth of a conventional optical module.
Figure 14:
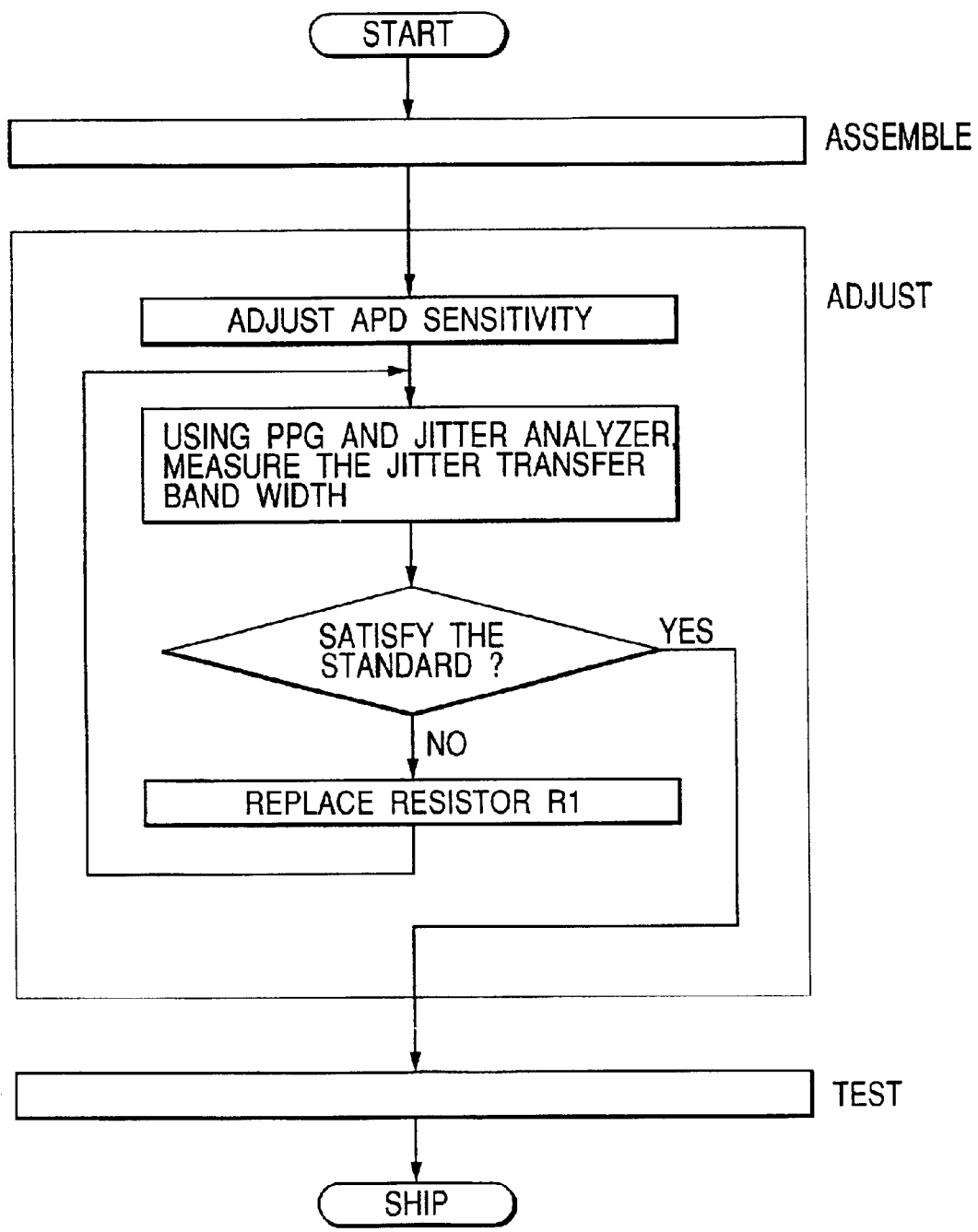
FIG. 14 is a flow chart showing an example of procedure from assembly to shipment of the conventional optical module.

In a signal 64a which is transmitted through the optical fiber there occurs a jitter, tj, due to a waveform distortion which the driver IC has, a waveform distortion induced at the time of electro-optical conversion in the laser diode 63, or a waveform distortion based on a dispersion characteristic of the optical fiber 64. The jitter is added when such an optical communication system as shown in FIG. 11 is cascade-connected, making the proper signal transmission impossible. In the CDR IC, therefore, it is necessary to suppress the jitter at a certain frequency, ft, or higher as in FIG. 12. The frequency, ft, and the jitter suppressing quantity are defined by a standard, so the optical receiver must observe the standard.

Figure 1:
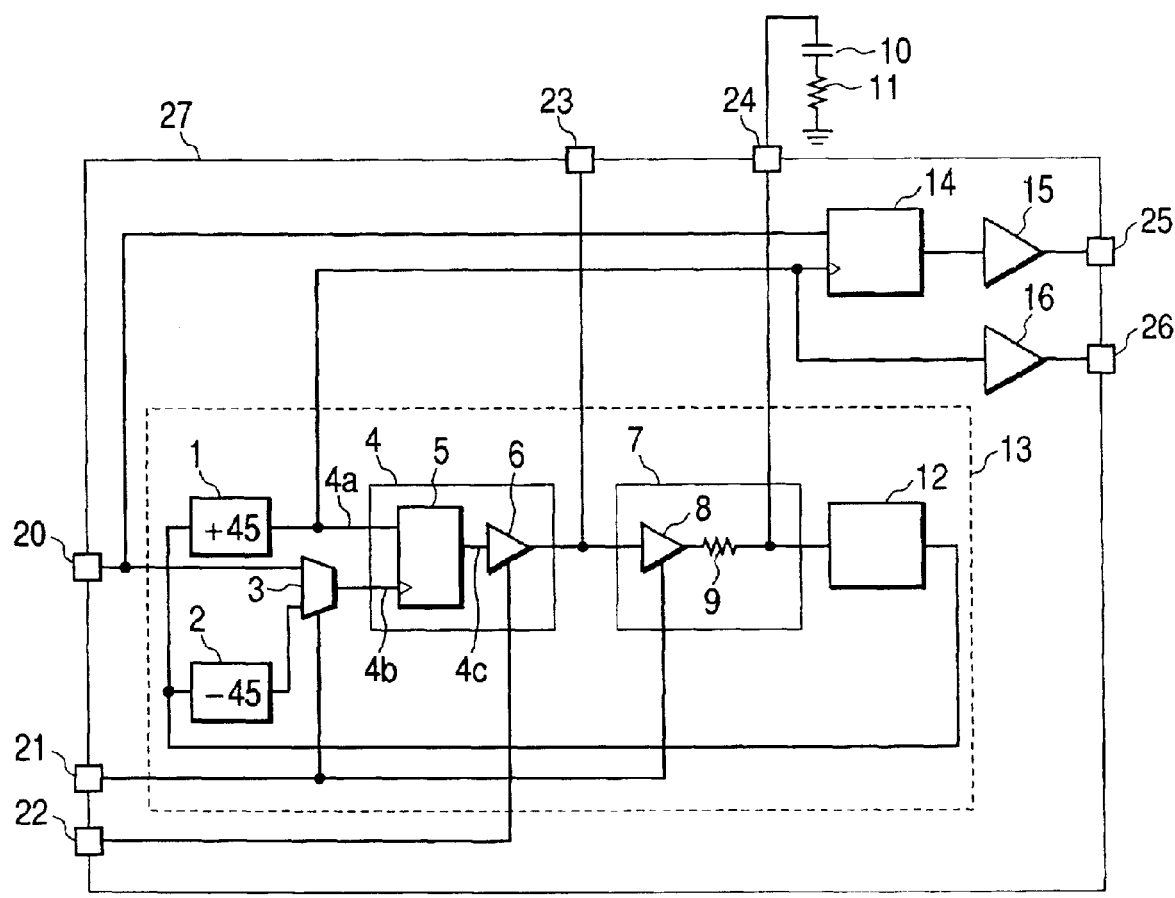
FIG. 1 is a circuit diagram illustrating a CDR IC according to the first embodiment of the present invention.

The CDR IC used in the optical module according to the present invention will be described below with reference to FIGS. 1, 2 and 3. FIG. 1 is a circuit diagram showing a CDR IC of the first embodiment used the optical module according to the present invention.

Figure 2:
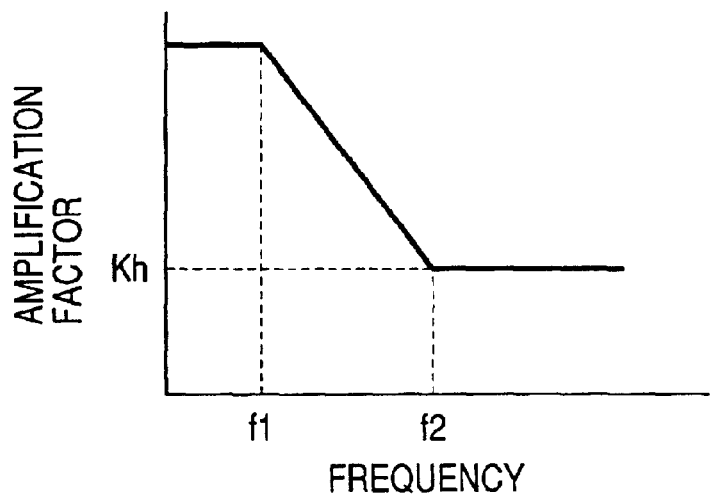
FIG. 2 illustrates a characteristic of a filter circuit in the CDR IC.

In FIG. 1, the CDR IC, indicated at 27, is made up of a PLL (phase locked loop) 13, a decision circuit 14, a data output buffer 15, and a clock output buffer 16, the PLL 13 comprising a +45° phase shifter 1, a −45° phase shifter 2, a data input pad 20, a selector 3 for selecting either data provided from a data input pad 20 or an output from the −45 phase shifter 2, a phase detector 4, a filter circuit 7, and a VCO (voltage-controlled oscillator) 12, the phase detector 4 comprising a sample & hold type phase detecting portion 5 for comparing the phase of an output signal provided from the selector 3 with the phase of an output signal provided from the +45° phase shifter 1 and a variable gain portion 6 capable of changing the amplification factor by trimming the resistance value in the circuit capable of providing a high impedance output in accordance with a signal from a test pad 21, the filter circuit 7 comprising an amplifier circuit portion 8 capable of providing a high impedance output in accordance with a signal from a test pad 22, a resistor 9 located within the IC, and external capacitor 10 and resistor 11 both connected to the resistor 9 through a pad 24, the filter circuit 7 having such a lag-lead characteristic as shown in FIG. 2.

In this embodiment, the CDR IC 27 has two operational states capable of being switched from one to the other by the test pads 21 and 22. One is a state ("normal operation" hereinafter) in which the IC is mounted on the optical module and a clock signal is reproduced from an input data signal, and the other is a state("jitter transfer bandwidth adjustment" hereinafter) in which in a DC test of IC before mounting on the optical module a jitter transfer bandwidth is measured for adjustment.

In normal operation, the selector 3 is set so that a signal obtained by causing the output of VCO 12 to lead 45° and a signal provided from the data input pad 20 are fed to the phase detector 4, while in jitter transfer bandwidth adjustment the selector 3 is set so that a signal obtained by causing the output of VCO 12 to lead 45° and a signal obtained by causing the output of VCO 12 to lag 45° are fed to the phase detector 4.

Now, with reference to FIG. 3, a description will be given below about the normal operation of the CDR IC 27.

Figure 3:
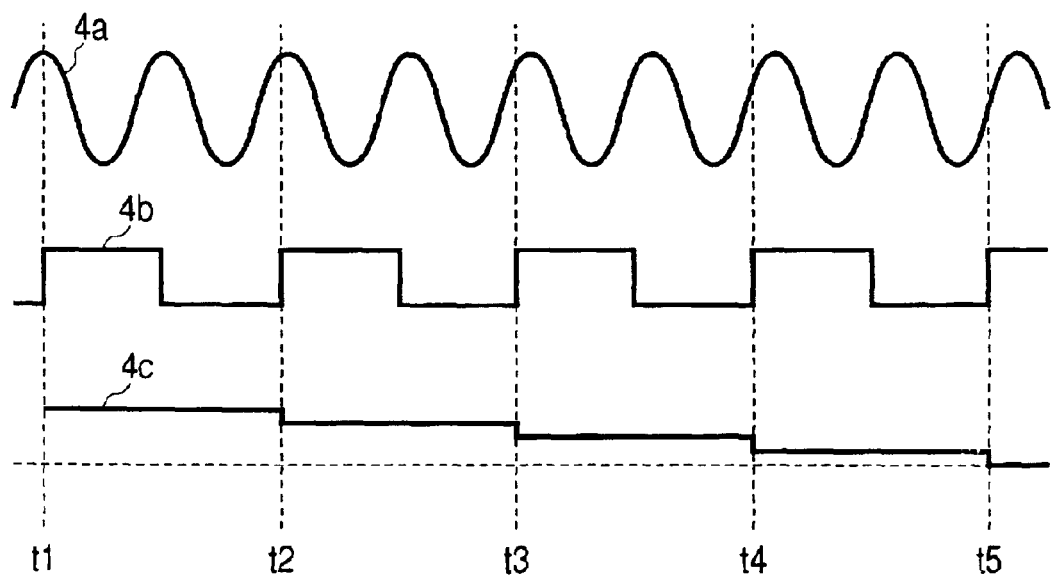
FIG. 3 illustrates waveforms of various portions in normal operation of the CDR IC.

FIG. 3 shows a relation among the waveform of an input 4a to the phase detector 4 obtained by causing the output of VCO 12 to lead 45°, an input waveform 4b from the data pad 20 to the phase detector 4, and an output waveform 4c from the phase detecting portion 5 in the phase detector 5. Although the waveform 4b from the data input pad 20 is originally a random pattern, it is represented in terms of alternate Hi and Low waveforms for ease of explanation.

At a leading edge of the waveform 4b from the data input pad 20 the phase detecting portion 5 in the phase detector 4 samples and holds the waveform 4a obtained by causing the output of VCO 12 to lead 45°. Therefore, at time t1, the output 4c from the phase detecting portion 5 in the phase detector 4 has an amplitude of the output waveform from VCO 12. This voltage is inputted to VCO 12 via the variable gain portion 6 in the phase detector 4 and the filter 7, making low the frequency generated from VCO 12 and shifting the phase of the 45°-leading waveform 4a from the output of VCO 12 relative to the waveform 4b provided from the data input pad 20. In this way PLL 13 operates so that the waveform 4b from the data input pad 20 and the 45°-leading waveform 4a from the output of VCO 12 are put in phase with each other.

Figure 4:
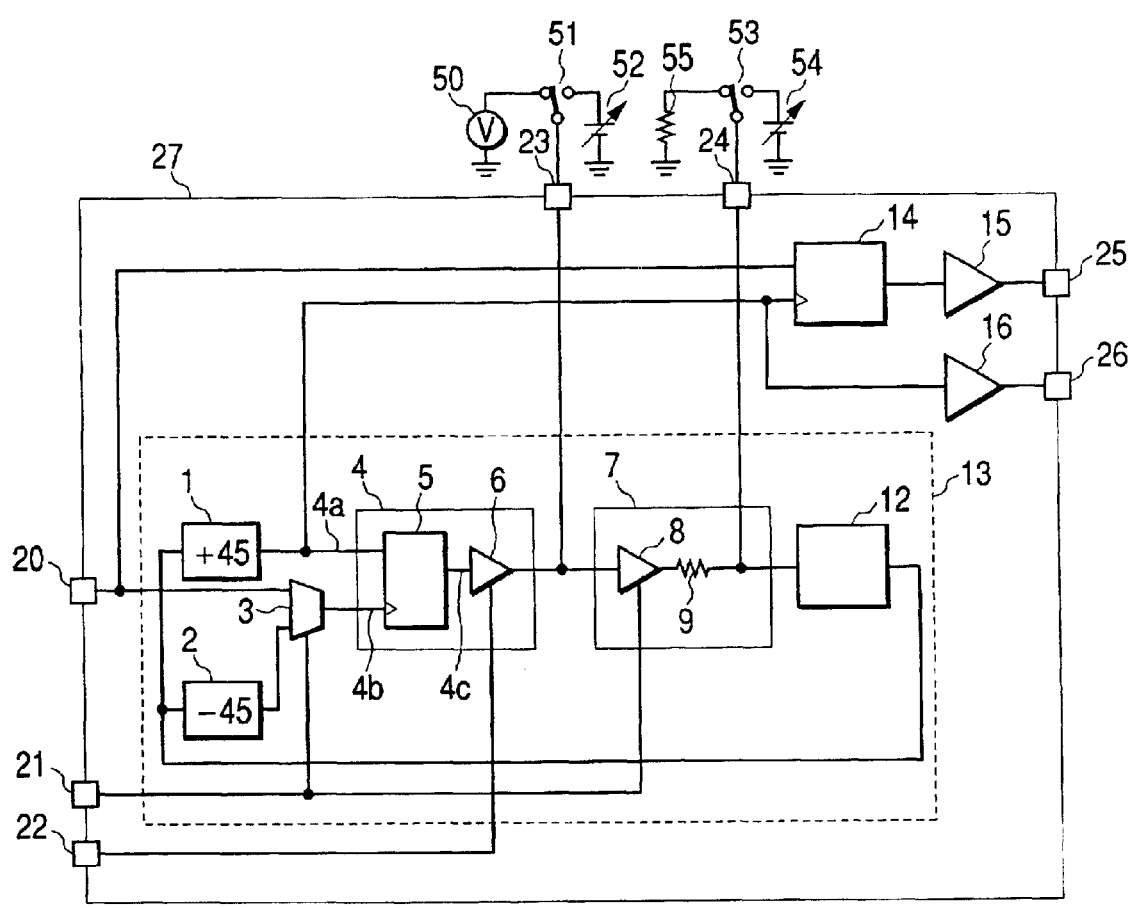
FIG. 4 is a circuit diagram showing a circuitry in adjusting a jitter transfer bandwidth of the CDR IC.
Figure 5:
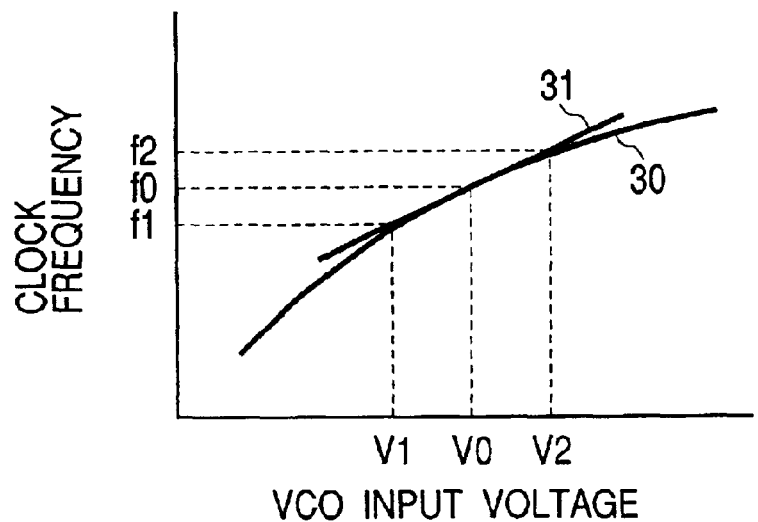
FIG. 5 illustrates a method for measuring a VCO modulation sensitivity in jitter adjustment for the CDR IC.
Figure 6:
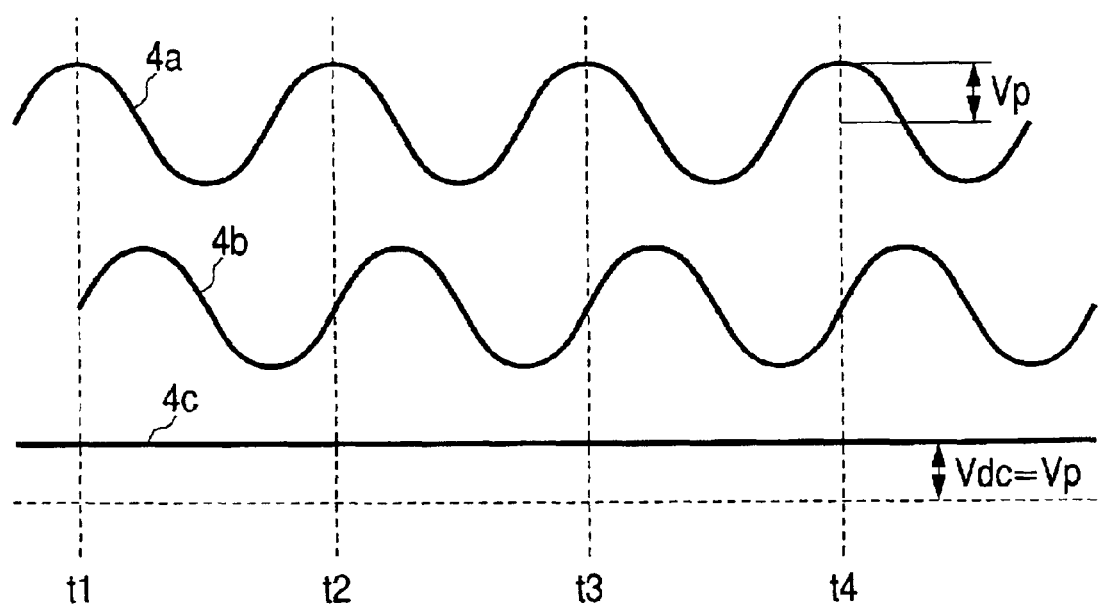
FIG. 6 illustrates waveforms of various portions in jitter adjustment for the CDR IC.

Next, with reference to FIGS. 4, 5 and 6, the following description is provided about the operation of CDR IC 27 in jitter transfer bandwidth adjustment.

FIG. 4 is a circuit diagram of the CDR IC 27 in jitter transfer bandwidth adjustment. In the same figure, a switch 51 capable of selecting a variable voltage source 52 and a voltmeter 50 is connected to a pad 23 which is provided at an output of the phase detector 4 in the CDR IC 27, while to a pad 24 provided in the filter circuit 27 is connected a switch 53 which can select, instead of the capacitor 10 and resistor 11, a variable voltage source 54 and a resistor 55 having the same resistance value as the resistor 11.

The jitter transfer bandwidth, ωjt, is represented by the following Expression (1):

$$\omega jt = Kd \times Ad \times Kh \times Ko \tag{1}$$

where Kd stands for a detection sensitivity of the phase detecting portion 5 in the phase detector 4, Ad stands for an amplification factor of the variable gain portion 6 in the phase detector 4, Kh stands for an amplification factor at frequency f2 or higher of the filter circuit 7 having such a lag-lead characteristic as shown in FIG. 2, and Ko stands for a modulation frequency of VCO 12.

For adjusting the jitter transfer bandwidth, first Kh×Ko is measured and then the amplification factor of the variable gain portion 6 in the phase detector 4 is adjusted by trimming the resistance value so as to give a desired jitter transfer bandwidth.

Kh×Ko is measured in the following manner. In FIG. 4, the test pad 22 is set so as to give a high impedance output from the variable gain portion 6 in the phase detector 4, the switch 51 is set for connection with the variable voltage source 52, and the switch 53 is set for connection with the resistor 55. Then, as shown in FIG. 5, the variable voltage source is set at voltages V1 and V2 near a voltage V0 at which the frequency of a signal outputted from a clock output pad 26 becomes equal to a lock frequency f0 of the CDR IC 27, and the frequency of a signal outputted from the clock output pad 26 is measured. Given that the frequency of a signal outputted from the clock output pad 26 at voltage V1 is f1 and that of a signal outputted from the clock output pad 26 at voltage V2 is f2, Kh×Ko can be represented by the following Expression (2):

$$Kh \times Ko \approx (f2-f1)/(V2-V1) \tag{2}$$

Next, in FIG. 4, the test pad 21 is set so that the selector 3 is set to have a 45°-leading signal from the output of VCO 12 and a 45°-lagging signal from the VCO output applied to the phase detector 4 and so that the amplifier portion in the filter circuit 7 provides a high impedance output. Likewise, the test pad 22 is set so that the variable gain portion 6 in the phase detector 4 operates as an amplifier circuit, the switch 51 is set for connection with the voltmeter 50, the switch 53 is set for connection with the voltage source 54, and the voltage source 54 is set so that the frequency of a signal outputted from the clock output pad 26 becomes f0. The value of the voltmeter 50 is equal to Kd×Ad, so for adjustment into a desired jitter transfer bandwidth ωjt, the amplification factor of the variable gain portion 6 in the phase detector 4 is adjusted so as to be ωjt/(Kh×Ko), for example, by trimming the resistance value.

The reason why the value of the voltmeter 50 is equal to Kd×Ad will be stated below with reference to FIG. 6.

The signal 4a resulting from leading the output of VCO 12 by 45° and a signal resulting from lagging the output of VCO 12 by 45° are inputted to the phase detector 4. As the phase detecting portion 5 in the phase detector 4 there is used a sample & hold type. When the output signal from VCO 12 is sinusoidal, the 45°-leading signal 4a from the output of the VCO 12 and the 45°-lagging signal 4b from the VCO 12 are 90° out of phase with each other, so the output of the phase detecting portion 5 exhibits the same value of amplitude as the amplitude Vp of the output signal from VCO 12. Moreover, in the case where the output signal from VCO 12 is sinusoidal, the detection sensitivity of the phase detecting portion 5 in the phase detector 4 in phase-locked condition of CDR IC 27 corresponds to a gradient at t5 of the output signal from VCO 12 as in FIG. 3, so the value thereof becomes equal to the amplitude Vp of the output signal from VCO 12.

This is because the output 4a of VCO 13 is represented by the following Expression (3) if it is sinusoidal:

$$4a = Vp \sin(\omega t) \tag{3}$$

The gradient Δ of the waveform 4a is represented by differentiation of Expression (3) and is therefore:

$$\Delta = Vp \cos(\omega t) \tag{4}$$

Since t5 in phase lock condition is equal to the point of t=0:

$$\Delta = Vp \tag{5}$$

Accordingly, the detection sensitivity of the phase detecting portion 5 in the phase detector 4 is equal to the amplitude Vp of the output signal in VCO 12.

Thus, the reading on the voltmeter 50 becomes equal to Kd×Ad, and by adjusting the value of Ad by trimming it becomes possible to adjust the jitter transfer bandwidth of CDR IC 27 to a desired value.

Although in FIG. 1 the filter circuit 7 is composed of the amplifier circuit portion 8, resistor 9 in the IC and external capacitor 10 and resistor 11, it is not always necessary to adopt such a configuration insofar as there is obtained such a lag-lead characteristic as shown in FIG. 2.

Figure 7:
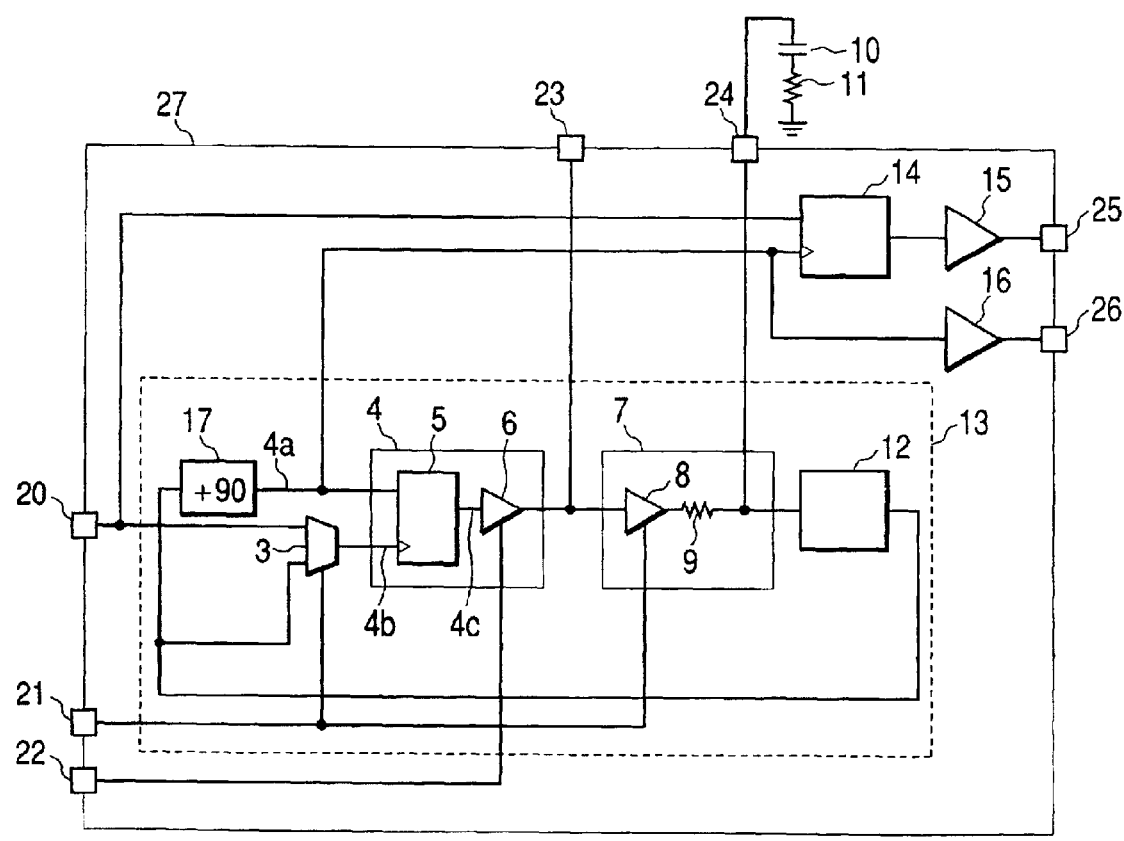
FIG. 7 is a circuit diagram illustrating a CDR IC according to another embodiment of the present invention.
Figure 8:
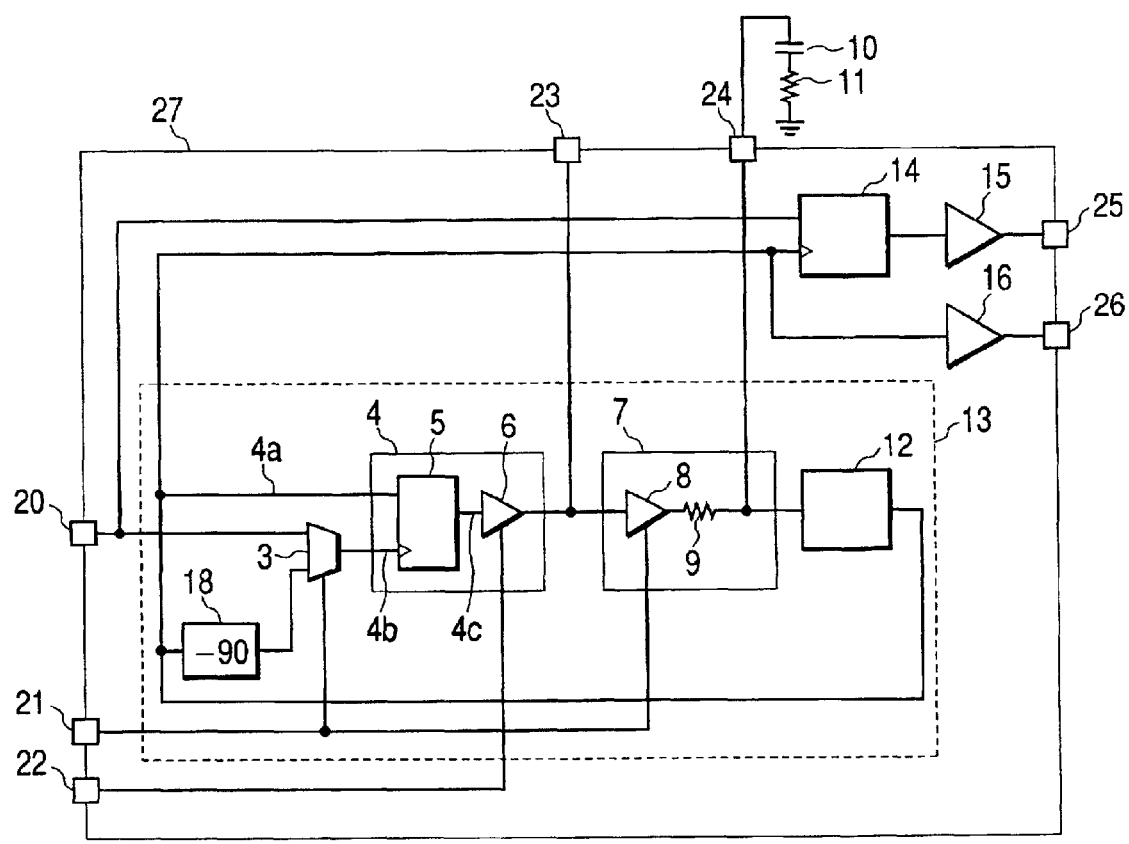
FIG. 8 is a circuit diagram illustrating a CDR IC according to a further embodiment of the present invention.

In jitter transfer bandwidth adjustment it suffices for a 90°-shifted output of VCO 12 to be inputted to the phase detecting portion 5 in the phase detector 4 and therefore a +90° phase shifter 17 may be connected between VCO 12 and the phase detector 4, as shown in FIG. 7. Further, as shown in FIG. 8, a −90° phase shifter 18 may be connected between the VCO 12 and the selector 3.

In case of using both +45° phase shifter and −45° phase shifter, it is possible to let a phase difference of 90° occur constantly because phase shifts resulting from circuit characteristics of the phase shifters offset each other.

According to this embodiment, since the gain of the variable gain portion 6 in the phase detector 4 is changed by resistance trimming and it is thereby possible to adjust the jitter transfer bandwidth, it is not required to make adjustment at the time of assembling the module. Consequently, it becomes possible to reduce the cost of the optical receiver.

Besides, as shown in FIG. 4, the adjustment of the jitter transfer bandwidth can be made using the voltage sources 52, 54, the voltmeter 50 and the frequency meter 90 without using the expensive pulse pattern generator 76 and jitter analyzer 77, thus making it possible to reduce the cost of the optical receiver.

Figure 9:
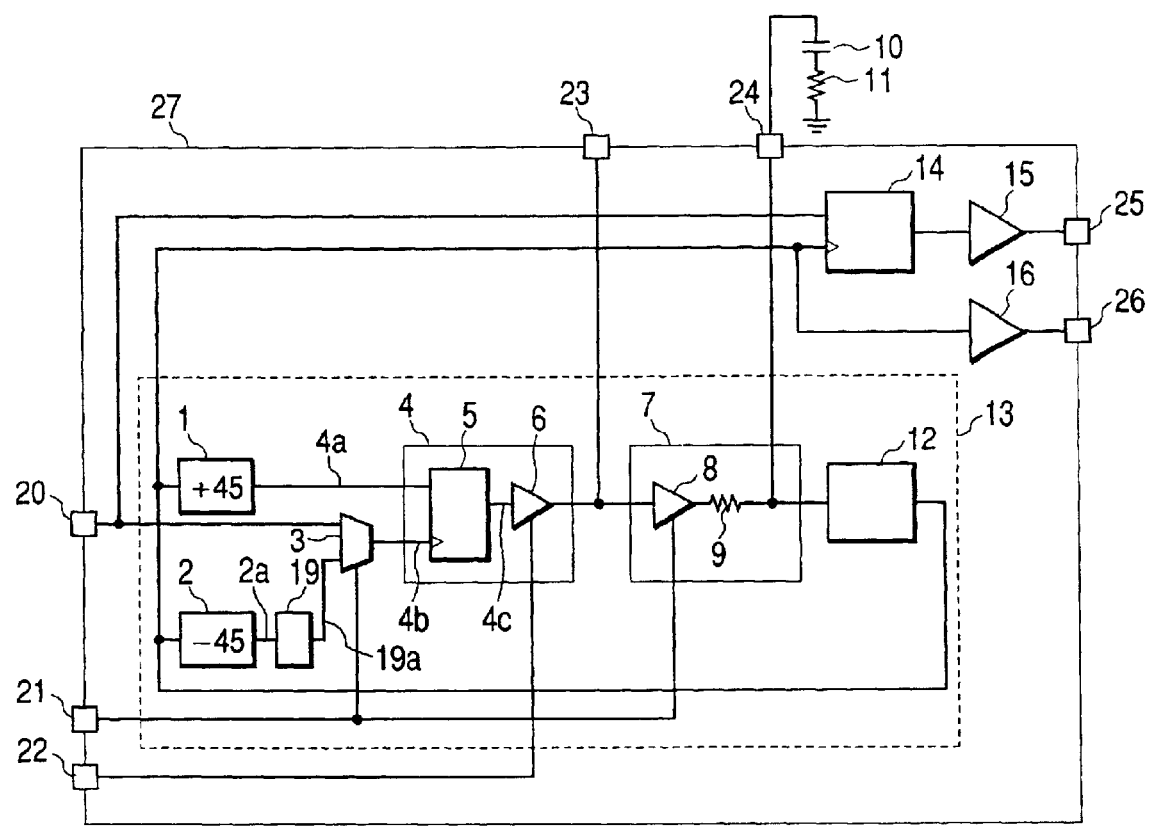
FIG. 9 is a circuit diagram illustrating a CDR IC according to a still further embodiment of the present invention.

FIG. 9 is a circuit diagram illustrating a CDR IC in an optical module according to a further embodiment of the present invention.

In the same figure, the CDR IC of this embodiment, indicated at 27, comprises a PLL (phase locked loop) 13, a decision circuit 14, a data buffer 15, and a clock buffer 16, the PLL 13 comprising a +45° phase shifter 1, a −45° phase shifter 2, a frequency divider 19 connected to an output of the −45° phase shifter 2, a selector 3 for selecting either an output from a data input pad 20 or an output from the frequency divider 19, a phase detector 4, a filter circuit 7, and a VCO (voltage-controlled oscillator) 12, the phase detector 4 comprising a sample & hold type phase detecting portion 5 for comparing the phase of an output from the selector 3 with that of an output from the +45° phase shifter 1 and a variable gain portion 6 capable of changing the amplification factor by trimming the resistance value in the circuit and capable of providing a high impedance output in accordance with a signal from a test pad 21, the filter circuit comprising an amplifier circuit portion 8 capable of providing a high impedance output in accordance with a signal from a test pad 22, a resistor 9 in the IC, and external capacitor 10 and resistor 11 connected to the resistor 9 through a pad 24, the filter circuit 7 having such a lag-lead characteristic as shown in FIG. 2.

In FIG. 9, the test pad 21 is set so that the selector 3 is set to have a 45°-leading signal from the output of VCO 12 and a 45°-lagging signal from the VCO output applied to the phase detector 4 and so that the amplifier portion 8 in the filter circuit 7 provides a high impedance output. Likewise, the test pad 22 is set so that the variable gain portion 6 in the phase detector 4 operates as an amplifier circuit, a switch 51 is set for connection with a voltmeter 50, a switch 53 is set for connection with a voltage source 54, and the voltage source 54 is set so that the frequency of a signal outputted from a clock output pad 26 becomes f0. The resulting waveform is as shown in FIG. 10.

Figure 10:
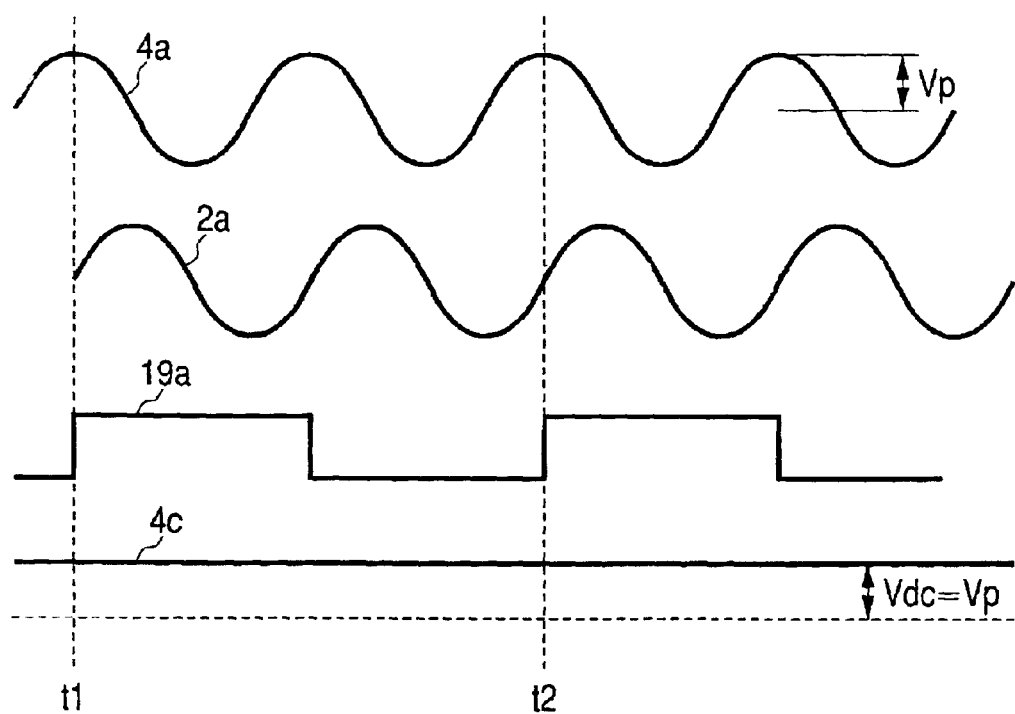
FIG. 10 illustrates waveforms of various portions in jitter adjustment for the CDR IC shown in FIG. 9.

In FIG. 10, indicated at 4a is the waveform of an input 4a of the phase detector 4 obtained by causing the output of VCO 12 to lead 45°, indicated at 2a is the waveform of an output 2a of the phase shifter 2 obtained by causing the output of VCO 12 to lag 45°, indicated at 19a is the waveform of an output 19a of the frequency divider 19 obtained by dividing the waveform 2a to a half with the frequency divider 19, and indicated at 4c is the waveform of an output 4c of the phase detecting portion 5 in the phase detector 4.

Since sampling points t1 and t2 of the phase detecting portion 5 in the phase detector 4 become peak points of the waveform 4a, the output of the phase detecting portion 5 takes the same value as the amplitude Vp of an output signal from VCO 12 and thus it is possible to obtain a detection sensitivity of the phase detecting portion 5.

In the configuration of FIG. 1, since the signal 4b in normal operation is a data signal, the frequency thereof is a half or less of the signal 4b in jitter transfer bandwidth adjustment which signal is a clock signal. That is, the circuit in which the signal 4b is inputted in the phase detecting portion 5 of the phase detector 4 requires an operating frequency twice as high as that in normal operation, so that there occurs a wasteful portion in the circuit due to the resulting necessity of allowing a large amount of current to flow to permit a high-speed operation.

In the configuration of FIG. 9, it suffices for the phase detecting portion 5 in the phase detector 4 to sample and hold with a cycle which is half of that in the configuration of FIG. 1. Thus, it becomes easier to make a circuit design in the case where the CDR IC handles a high-speed signal. Further, in case of using the same circuit, it is possible to use a frequency up to twice as high.

Although in FIG. 9 there are used both +45° and −45° phase shifters, there may be used a +90° or −90°0 phase shifter as in FIGS. 7 and 8.

Figure 15:
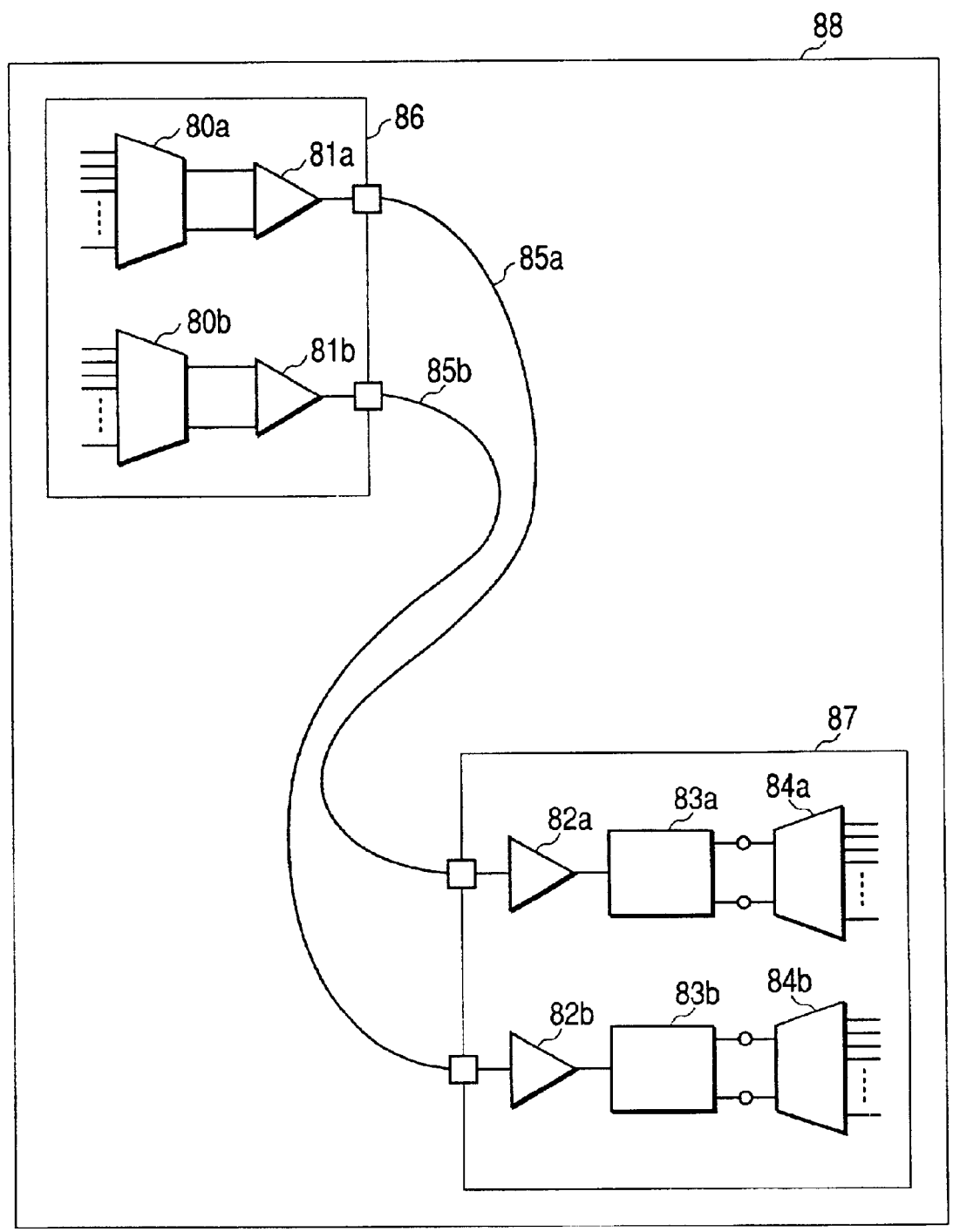
FIG. 15 illustrates a still further embodiment using a CDR IC.

FIG. 15 is a configuration diagram using a CDR IC according to a further embodiment of the present invention. In the same figure, a server or router 88 is composed of a substrate with plural multiplexers 80 and transmission line drivers 81 mounted thereon, a substrate 87 with plural receiving amplifiers 82, CDR ICs 83 and demultiplexers 84 mounted thereon, and plural transmission lines 85 for connection between both substrates.

In the case of a server, CPUs are mounted on the substrates 86 and 87, while in the case of a router, switching ICs are mounted on the substrates. The transmission lines 85 are, for example, coaxial or twisted pair cables or lines formed on a substrate. In a server or a router, a signal exceeding 1 GHz is allowed to flow in the transmission lines 85 for increasing the amount of data transmitted between the substrates and for decreasing the number of cables and of signal lines on the substrates to reduce the manufacturing cost. With such a signal exceeding 1 GHz, it is difficult to phase data and clock with each other and therefore only the data signal is transmitted, while clock is reproduced in the CDR IC 83.

For the CDR IC 83 a jitter standard is established as is the case with the optical receiver and for observing the standard it is necessary to adjust the jitter transfer bandwidth. Since plural CDR ICs are mounted on a substrate, several ten minutes to several hours are needed for the adjustment, but according to the present invention all that is required is a mere mounting of IC, thus making it possible to reduce the cost of the server or router.

According to the present invention, the cost for adjustment at the time of assembling the optical module is reduced, thereby permitting the provision of a less expensive optical module.

What is claimed is:

1. An optical module comprising:
   a photodiode or avalanche photodiode for converting a light signal into an electric signal;
   a transimpedance amplifier for current/voltage conversion;
   a voltage amplifier; and
   a clock and data recovery IC,
   the clock and data recovery IC having a phase locked loop, the phase locked loop comprising:
   a voltage-controlled oscillator;
   a +45° phase shifter which causes the phase of one branched output signal from the voltage-controlled oscillator to lead 45°;
   a −45° phase shifter which causes the phase of the other branched output signal from the voltage-controlled oscillator to lag 45°;
   a selector for selecting either data provided from a data input pad or an output from the −45° phase shifter;
   a phase detector which compares the phase of an output selected by the selector with the phase of an output from the +45° phase shifter; and
   a filter circuit which receives an output signal from the phase detector and which provides an output signal to the voltage-controlled oscillator.

2. An optical module according to claim 1, wherein when a clock signal is reproduced using a data signal inputted from the data input pad, both an output signal from the +45° phase shifter and a signal from the data input pad are fed to the phase detector.

3. An optical module comprising:
   a photodiode or an avalanche photodiode for converting a light signal into an electric signal;
   a transimpedance amplifier for current/voltage conversion;
   a voltage amplifier; and
   a clock and data recovery IC,
   the clock and data recovery IC having a phase locked loop, the phase locked loop comprising:
   a voltage-controlled oscillator;
   a +90° phase shifter which causes the phase of one branched output signal from the voltage-controlled oscillator to lead 90°;
   a selector for selecting either the other branched output signal from the voltage-controlled oscillator or data provided from the data input pad;
   a phase detector which compares an output selected by the selector with the phase of an output from the +90° phase shifter; and
   a filter circuit which receives an output signal from the phase detector and which provides an output signal to the voltage-controlled oscillator.

4. An optical module according to claim 3, wherein when a clock signal is reproduced using a data signal inputted from the data input pad, both an output signal from the +90° phase shifter and a signal from the data input pad are inputted to the phase detector.

5. An optical module comprising:
   a photodiode or avalanche photodiode for converting a light signal into an electric signal;
   a transimpedance amplifier for current/voltage conversion;
   a voltage amplifier; and
   a clock and data recovery IC,
   the clock and data recovery IC having a phase locked loop, the phase locked loop comprising:
   a voltage-controlled oscillator;
   a −90° phase shifter which causes the phase of one branched output signal from the voltage-controlled oscillator to lag 90°;
   a selector for selecting either data provided from a data input pad or an output from the −90° phase shifter;
   a phase detector which compares the phase of an output selected by the selector with the phase of the other branched output signal from the voltage-controlled oscillator; and
   a filter circuit which receives an output signal from the phase detector and which provides an output signal to the voltage-controlled oscillator.

6. An optical module according to claim 5, wherein when a clock signal is reproduced using a data signal inputted from the data input pad, both the other branched output signal from the voltage-controlled oscillator and a signal from the data input pad are inputted to the phase detector.

7. An optical module according to claim 1, wherein a frequency divider is disposed between the voltage-controlled oscillator and the selector.

8. An optical module according to claim 3, wherein a frequency divider is disposed between the voltage-controlled oscillator and the selector.

9. An optical module according to claim 5, wherein a frequency divider is disposed between the voltage-controlled oscillator and the selector.

10. An optical module comprising:
    a photodiode or avalanche photodiode for converting a light signal into an electric signal;
    a transimpedance amplifier for current/voltage conversion;
    a voltage amplifier; and
    a clock and data recovery IC,
    the clock and data recovery IC having been subjected to adjustment of a jitter transfer bandwidth before being mounted on the optical module.

11. An optical module according to claim 8, wherein the clock and data recovery IC has a phase locked loop, the phase locked loop including a voltage-controlled oscillator, a phase shifter for changing the phase of an output signal from the voltage-controlled oscillator, a selector for selecting either data provided from a data input pad or an output from the voltage-controlled oscillator, a phase detector, and a filter circuit which receives an output from the phase detector and which provides an output signal to the voltage-controlled oscillator.

12. A method of making an optical module, comprising the steps of:
    adjusting a jitter transfer bandwidth of a clock and data recovery IC;
    mounting the thus-adjusted clock and data recovery IC on an optical module; and
    mounting on the optical module a photodiode or avalanche photodiode for converting a light signal into an electric signal, a transimpedance amplifier for current/voltage conversion, and a voltage amplifier.

13. A method according to claim 10, wherein in the step of adjusting a jitter transfer bandwidth of the clock and data recovery IC, the clock and data recovery IC has a data input pad, a data output pad, a clock output pad, a phase detector, a voltage-controlled oscillator, and a phase shifter for changing the phase of an output waveform provided from the voltage-controlled oscillator, and at least two output waveforms outputted from the voltage-controlled oscillator and about 90° out of phase with each other are inputted to the phase detector.

14. An optical communication system comprising:
   a multiplexer for time-multiplexing a signal;
   a optical transmitter;
   an optical fiber for the transmission of a light signal outputted from the optical transmitter;
   a optical receiver which receives a light signal from the optical fiber and converts it into an electric signal and which reproduces a clock; and
   a demultiplexer which separates the electric signal,
   wherein the optical receiver is the optical module described in any of claims 1, 3, 5, 10.

* * * * *